United States Patent [19]

Ando et al.

[11] Patent Number: 4,652,697

[45] Date of Patent: Mar. 24, 1987

[54] ALUMINUM-STABILIZED SUPERCONDUCTING WIRE

[75] Inventors: Toshinari Ando; Yoshikazu Takahashi, both of Ibaraki; Masataka Nishi, Mito; Susumu Shimamoto, Ibaraki; Katsuzo Aihara; Naofumi Tada, both of Hitachi, all of Japan

[73] Assignees: Hitachi, Ltd.; Japan Atomic Energy Research Institute, both of Tokyo, Japan

[21] Appl. No.: 641,175

[22] Filed: Aug. 15, 1984

[30] Foreign Application Priority Data

Aug. 15, 1983 [JP] Japan .............................. 58-148116

[51] Int. Cl.$^4$ .......................................... H01B 12/00
[52] U.S. Cl. .............................. 174/128 S; 174/126 S; 29/599
[58] Field of Search ............... 174/15 S, 126 S, 128 S; 29/599; 428/930

[56] References Cited

U.S. PATENT DOCUMENTS

| 3,983,521 | 9/1976 | Furuto et al. | 174/126 S X |
| 4,329,539 | 5/1982 | Tanaka et al. | 174/126 S X |
| 4,501,062 | 2/1985 | Hillmann et al. | 174/126 S X |

FOREIGN PATENT DOCUMENTS 3430159 3/1985 Fed. Rep. of Germany ... 174/128 S 1394724 5/1975 United Kingdom ................ 428/930

OTHER PUBLICATIONS

Nomura, H. et al; "Construction of a Solenoid Magnet with a New Aluminum Stabilized Superconductor", Cryogenics; Oct. 1971; pp. 396–401.

Irie, F. et al; "Aluminum-Stabilized Nb$_3$Sn Multifilamentary Wire for a High-Field Pulse Magnet"; Proceedings of the International Cryogenic Materials Conference, Kobe, Japan; 11–14, May 1982; pp. 477–479.

Primary Examiner—Arthur T. Grimley
Assistant Examiner—Morris H. Nimmo
Attorney, Agent, or Firm—Antonelli, Terry & Wands

[57] ABSTRACT

An aluminum-stabilized superconducting wire comprises an aluminum member, a copper member, and a first diffusion barrier layer formed between the aluminum member and the copper member. The copper member contains a plurality of bundles each having a multiplicity of fine filaments of Nb$_3$Sn embedded in a copper alloy and a second diffusion barrier layer surrounding the copper alloy. Preferably, the ratio m in the cross-sectional areas between the first diffusion barrier layer and the aluminum member is selected to meet the condition of $0.03 \leq m < 3$. The aluminum member is disposed at the central portion of the superconducting wire.

2 Claims, 10 Drawing Figures

ALUMINUM-STABILIZED SUPERCONDUCTING WIRE

BACKGROUND OF THE INVENTION

The present invention relates to a superconducting wire and, more particularly, to an aluminum-stabilized Nb₃Sn fine multifilamentary superconducting wire which exhibits a superior stability.

The Nb₃Sn fine multifilamentary superconducting wire has been used as the wires for a superconducting magnet which can generate a strong magnetic field of 10 tesla or higher. The most conventional example of the Nb₃Sn fine multifilamentary superconducting wire is shown in FIGS. 1a and 1b. This superconducting wire 1 has a copper member 6 in which are embedded a plurality of bundles 5 each consisting of a multiplicity of Nb₃Sn fine filaments 3 embedded in a Cu-Sn bronze 2 which in turn is enveloped by a diffusion barrier layer 4. FIG. 1a shows an example of the Nb₃Sn fine multifilamentary superconducting wire 1 having a circular cross-section, while FIG. 1b shows an example of that having, a rectangular cross-section.

Generally, from the viewpoint of engineering, the Nb₃Sn fine filament 3 has a diameter of about several micron meters (μm) and the number of the Nb₃Sn fine filaments contained in one bundle 5 ranges from several tens to several thousands. Further, the number of the bundles 5 contained in one Nb₃Sn fine multifilamentary superconducting wire 1 ranges from several to several hundreds. In order to obtain a high electromagnetic stability, the superconducting wire usually contains a metallic material having a small specific electric resistance as a stabilizing material. In the superconducting wires shown in FIGS. 1a and 1b, the Cu member 6 serves as the stabilizing material. In general, an oxygen-free copper is used as the material of copper member 6.

In a process for producing the Nb₃Sn fine multifilamentary superconducting wire 1, there is required a diffusion heat treatment for forming Nb₃Sn. During the diffusion heat treatment, the Sn in the Cu-Sn bronze 2 tends to diffuse into the copper member 6 thereby contaminating the copper. This, however, is prevented by the diffusion barrier layer 4.

In the production of a superconducting magnet, a factor $\alpha$ given by the following formula (1) is used as a stabilizing parameter:

$$\alpha = \frac{\rho_{st} \cdot Id^2}{A_{st} \cdot p \cdot q} \quad (1)$$

where, $\rho_{st}$: specific electric resistance of stabilizing material,
Id: electric current in superconducting magnet,
$A_{st}$: cross-sectional area of stabilizing material,
p: effective circumferential length of cooling surface, and
q: heat flux from cooling surface.

The smaller the value of the factor $\alpha$ obtained from the formula (1) is, the higher the stability becomes. In particular, when the value of the factor $\alpha$ is smaller than 1, a state called "perfectly stabilized state" is attained, in which the cooling power can overcome the Joule's heat even when the superconducting state is broken.

Now, a smaller value of the factor $\alpha$ can be obtained by using a material having a small specific electric resistance $\rho_{st}$ appearing in the formula (1), provided that the geometrical size is constant. Since the specific electric resistance at cryogenic temperatures of a high-purity aluminum (purity higher than 99.99%) is as small as 1/5 to 1/10 of that of the oxygen-free copper, when the high-purity aluminum is used as a stabilizing material instead of the oxygen-free copper, the electromagnetic stability is extremely improved. However, since the high-purity aluminum is very ductile, it brings about a problem in that, when a composite body as the fine multifilamentary superconducting wire is subjected to a working such as drawing, there is too large difference in plastic workability between it and the other components. In consequence, this problem has greaty restricted the realization of the fine multifilamentary superconducting wire stabilized by aluminum.

FIGS. 2a and 2b show hitherto known examples of aluminum-stabilized fine multifilamentary superconducting wire. More specifically, FIG. 2a shows a cross-section of an aluminum-stabilized alloy system multifilamentary superconducting wire 9 in which a plurality of filaments 8 of a superconducting alloy, e.g., Nb-Ti, Nb-Ti-Zr or the like, are embedded in the high-purity aluminum member 7. On the other hand, FIG. 2b shows a cross-section of an aluminum-stabilized alloy system fine multifilamentary superconducting wire 9 having a construction in which a plurality of alloy system fine multifilamentary wires 10 and a plurality of high-purity aluminum wires 11 are stranded together and united by a solder 12 such as of Pb-Sn. Each of the alloy system fine multifilamentary superconducting wire 10 has a multiplicity of superconducting alloy filaments 8 embedded in the copper member 6.

As shown in FIGS. 2a and 2b, all of the known aluminum-stabilized fine multifilamentary superconducting wires apply to the alloy system superconductor and are not the one in which the Nb₃Sn superconductor is stabilized by aluminum. The reasons why such superconducting wire, i.e., a superconducting wire in which the Nb₃Sn superconductor is stabilized by aluminum, has not been obtained hitherto are attributable to the following facts. Namely, for example, if it were attempted to apply the construction shown in FIG. 2a to the Nb₃Sn fine multifilamentary superconducting wire, in other words if it were attempted to replace the copper member 6 in FIG. 1a or 1b with an aluminum member, the following problems would arise: firstly, since there is a large difference in plastic workability between the aluminum member and the other components, it is extremely difficult to execute sufficient drawing work of the composite body to obtain the intended fine multifilaments of Nb₃Sn and, secondly, when the drawn composite body is subjected to a diffusion heat treatment at a temperature range of between 600° and 800° C. to form the Nb₃Sn superconductor, the aluminum member is melted or softened thereby making it impossible to maintain the shape of the composite body. Further, for example, if it were attempted to apply the construction shown in FIG. 2b to the Nb₃Sn fine multifilamentary superconducting wire, when the aluminum wires 11 and the Nb₃Sn fine multifilamentary superconducting wires 10 would be stranded together a large strain would be applied to the latter thereby seriously impairing the superconducting properties and thus making the composite unusable.

An example of a superconducting wire in which the Nb₃Sn superconductor is stabilized by aluminum is disclosed in an article entitled "ALUMINUM-STABILIZED Nb₃Sn MULTIFILAMENTARY WIRE FOR A HIGH-FIELD PULSE-MAGNET" by F. Irie et al., appearing in PROCEEDINGS OF THE INTERNATIONAL CRYOGENIC MATERIALS CONFERENCE, Kobe, Japan, May 11 to 14, 1982, pp 477–479. This superconducting wire, however, has such a cross-sectional construction that the core of Nb₃Sn filaments is surrounded by aluminum, so that it will be quite difficult to subject it to a desired drawing work, because the aluminum has an extremely higher plastic workability than the core.

SUMMARY OF THE INVENTION

Accordingly, an object of the invention is to provide an aluminum-stabilized $Nb_3Sn$ fine multifilamentary superconducting wire which has been difficult to be realized by the prior art.

In compliance with the above object, the aluminum-stabilized $Nb_3Sn$ superconducting wire of the invention comprises, at least, fine multifilaments of $Nb_3Sn$ embedded in a copper member, an aluminum member and a diffusion barrier layer formed between the copper member and the aluminum member. Preferably, the ratio m in the cross-sectional areas between the diffusion barrier layer and the aluminum member is selected to meet the condition of $0.03 \leq m < 3$.

The above and other objects, features and advantages of the invention will become clear from the following description of the preferred embodiments when the same is read in conjunction with the accompanying drawings.

DESCRIPTION OF THE PREFERRED EMBODIMENTS

Figure 1A:
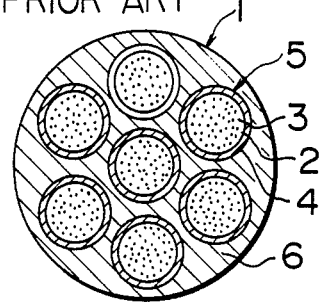
FIGS. 1a and 1b are sectional views of examples of conventional $Nb_3Sn$ fine multifilamentary superconducting wires.
Figure 1B:
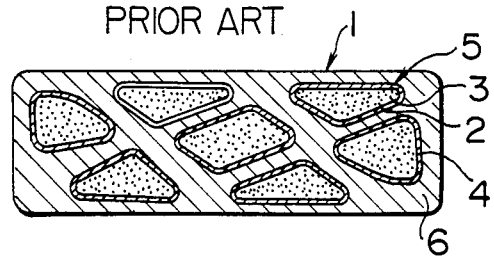
Figure 2A:
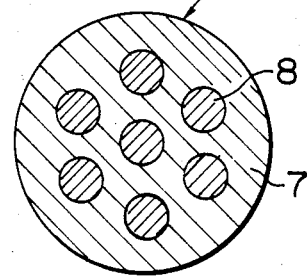
FIGS. 2a and 2b are sectional views of examples of conventional aluminum-stabilized alloy system superconducting wire.
Figure 2B:
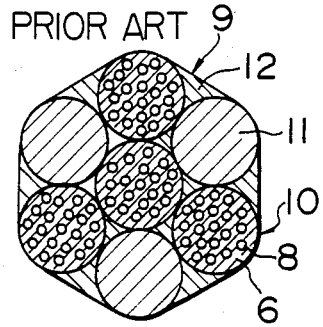
Figure 3A:
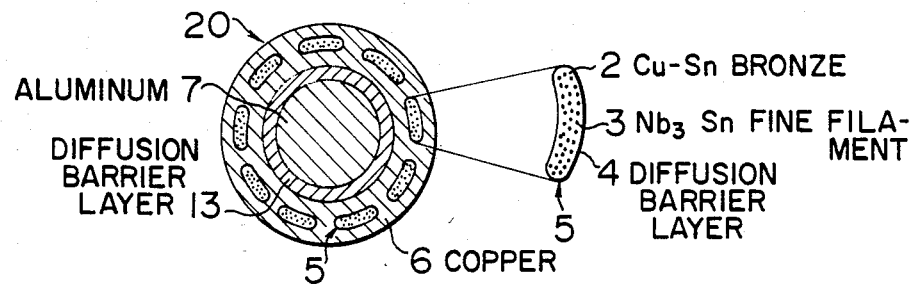
FIGS. 3a and 3b are sectional views of examples of aluminum-stabilized $Nb_3Sn$ fine multifilamentary superconducting wire of the invention.
Figure 3B:
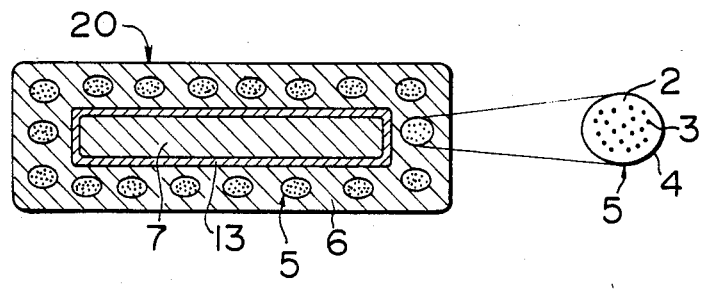

FIGS. 3a and 3b show in cross-section the examples of basic construction of aluminum-stabilized superconducting wire according to the invention. More specifically, FIG. 3a shows a superconducting wire having a circular cross-section, while FIG. 3b shows superconducting wire having a rectangular cross-section. Each of the aluminum-stabilized superconducting wires shown in FIGS. 3a and 3b has a copper member 6 in which are embedded several bundles 5 each constituted by a multiplicity of $Nb_3Sn$ fine filaments 3 embedded in a Cu-Sn bronze 2 which in turn is enveloped by a diffusion barrier layer 4. In addition, an aluminum member 7 enclosed by a diffusion barrier layer 13 is disposed in the central region of the superconducting wire.

An example of the method suitable for the production of the aluminum-stablized $Nb_3Sn$ fine multifilamentary superconducting wire of the invention will be described hereinunder, with specific reference to FIG. 4.

As a first step, a composite body 15 is prepared by means of drawing a composite consisting of an oxygen-free copper pipe 14, a pipe-shaped diffusion barrier layer 13 and a bar-shaped aluminum member 7. Meanwhile, a plurality of composite bodies 17 are prepared, each of which is constituted by a multiplicity of linear niobium members 16 embedded in the Cu-Sn bronze 2, a diffusion barrier layer 4 surrounding the bronze 2, and an oxygen-free copper pipe 14 surrounding the diffusion barrier layer 4.

The composite bodies 17 are placed together with the composite body 15 in an oxygen-free copper pipe 18 to form a composite body 19 which in turn is drawn into a wire of desired shape having smaller diameter. The drawn wire is then subjected to a diffusion heat treatment to cause a reaction between the niobium members 16 and the Sn contained in the Cu-Sn bronze 2, thus forming $Nb_3Sn$. In general, the diffusion heat treatment for $Nb_3Sn$ fine multifilamentary wires is conducted at a temperature ranging between 600° and 800° C. for a time length of 50 to 200 hours. In the production of the superconducting wire of the invention, however, since the aluminum is used, it is desirable that the heating temperature be below the melting temperature of aluminum which is 660° C. After the drawing work, the oxygen-free copper pipes 14 and 18 form the copper member 6 shown in FIG. 3.

Figure 4:
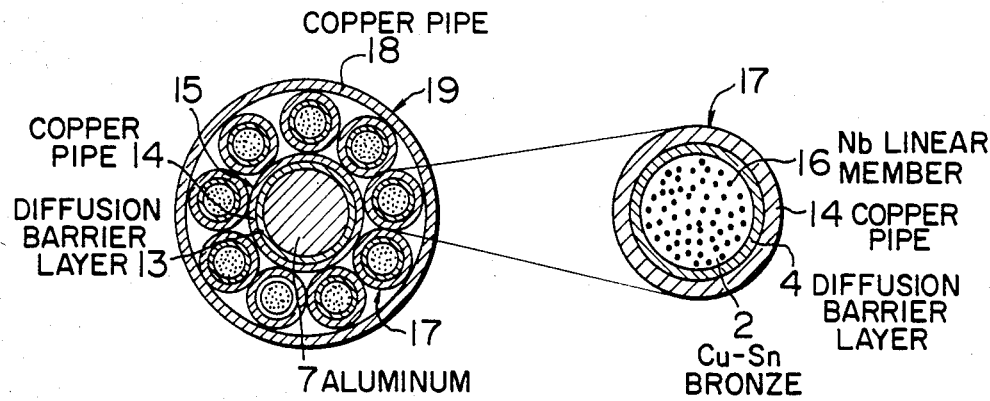
FIG. 4 is a sectional view illustrating an example of a method for producing the aluminum-stabilized $Nb_3Sn$ fine multifilamentary superconducting wire of the invention.
Figure 5:
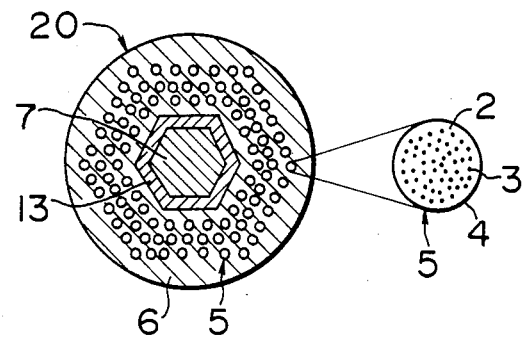
FIG. 5 is a sectional view of the aluminum-stabilized $Nb_3Sn$ fine multifilamentary superconducting wire in another example of the invention, produced by the principle of the method shown in FIG. 4.

FIG. 5 is a sectional view of another example of an aluminum-stabilized $Nb_3Sn$ fine multifilamentary superconducting wire of the invention, produced, in principle, by the method explained hereinbefore with reference to FIG. 4. In this example, a multiplicity of composite bodies 17 are disposed in layers between the composite body 15 and the oxygen-free copper pipe 18. The composite body 19 is drawn such that the it exhibits a generally hexagonal cross-sectional shape after the drawing. Subsequently, the outer peripheral portion of the copper member 6 is suitably finished such that the final product comes to have a circular cross-section.

In the invention, the diffusion barrier layer 13 has two important roles. Namely, a first role is to prevent contamination of aluminum due to reaction with copper during diffusion heat treatment, thereby ensuring the high purity of the aluminum which is essential for achieving a high stabilizing effect. From this viewpoint, it is necessary that the diffusion barrier layer be made of a material which is difficult to react with copper and aluminum. Examples of suitable material are Nb, Ta, Nb-based alloy and Ta-based alloy. It is not always necessary that the material of the diffusion barrier layer 13 be identical with the material of the diffusion barrier layer 4. The second role of the diffussion barrier layer 13 is to relieve the thermal contraction strain which may otherwise be imparted to the $Nb_3Sn$ filaments due to the difference in thermal expansion and contraction coefficient between the constituent materials. More specifically, in general, in case of the $Nb_3Sn$ fine multifilamentary superconducting wire there arises a difference in thermal contraction coefficient of about 1% between the bronze and the $Nb_3Sn$ filament, while the wire is cooled from the diffusion heat treatment temperature down to the temperature of liquid helium which is 4.2 K. This difference applies a compressive strain to the Nb3Sn filament, which in turn decreases the level of the critical current to an impractical level. For a practical use of the superconducting wire, the compressive strain should be not greater than 0.4%. On the other-hand, aluminum exhibits a still greater thermal contraction coefficient: namely, a coefficient which is greater by about 0.5% than that of the bronze. If there were no diffusion barrier layer 13, therefore, the compressive strain applied to the Nb3Sn filament would be further increased. The diffusion barrier layer generally exhibits a high mechanical strength and a small thermal contraction coefficient. The provision of the diffusion barrier layer, therefore, is effective in relieving the compressive strain applied to the Nb3Sn filament by the aluminum.

In order that the compressive strain imparted to the Nb3Sn filament in the presence of aluminum is maintained below 0.4%, it is necessary that the conditions be selected to satisfy the following formula (2):

$$m \geq \frac{\sigma_{Al}}{E_B \times \epsilon_B} \quad (2)$$

where, $E_B$: Young's modulus of the material of diffusion barrier layer 13 at 4.2 K, $\epsilon_B$: compressive strain of diffusion barrier layer, $\sigma_{Al}$: plastic stress in aluminum at 4.2 K, and m: ratio in cross-sectional areas between diffusion barrier layer and aluminum member 7.

The young's modulus $E_B$ is practically 17000 kg/mm². The compressive strain $\epsilon_B$ and plastic stress $\sigma_{Al}$ are practically 0.004 and 2 kg/mm², respectively. In such a case, the ratio m is calculated from formula (2) as being $m \geq 0.03$.

In view of the object of the invention, it is necessary that the composite specific electric resistance exhibited by the diffusion barrier layer and aluminum be smaller than that of copper. Since the material of diffusion barrier layer generally exhibits a specific electric resistance which is much greater than those exhibited by aluminum and copper, it is necessary that the following formula (3) be met:

$$m < \frac{\rho_{Cu}}{\rho_{Al}} - 1 \quad (3)$$

where, $\rho_{Cu}$ and $\rho_{Al}$ represent, respectively, specific electric resistance values of copper and aluminum.

Usually, the specific electric resistance is increased as the magnetic field intensity is increased. For instance, copper and aluminum exhibit specific electric resistance values of $4 \times 10^{-8}$ Ωcm and $1 \times 10^{-8}$ Ωcm, respectively, under the influence of the magnetic field of 10 tesla. As the magnetic field intensity is further increased, the specific electric resistance of aluminum scarcely changes, while the specific electric resistance of copper continues to rise and reaches a level of $5 \times 10^{-8}$ Ωcm when the magnetic field intensity reaches, for example, 12 tesla. Since the aluminum-stabilized fine multifilamentary wire is used at magnetic field intensity of not smaller than 10 tesla, a condition of m<3 is obtained by substituting the value of specific electric resistance at 10 tesla to the formula (3).

Practical embodiments of the invention will be described hereinunder. An aluminum-stabilized Nb3Sn fine multifilamentary superconducting wire having a construction as shown in FIG. 3a was produced by the method explained before in connection with FIG. 4. The Nb diffusion barrier layer 4 of each bundle 5 accommodated 331 (three hundreds and thirty one) Nb3Sn fine filaments 3 each having a diameter of about 4 μm. There are 59 bundles 5 embedded in an oxygen-free copper member 6. The diffusion barrier layer 13 was formed of Nb and had an outside diameter of 0.68 mm. A high-purity aluminum having a purity of 99.995% was used as the aluminum member 7. The diameter of the aluminum member 7 was 0.66 mm. Thus, from these dimensions the cross-sectional areas of the diffusion barrier layer and the aluminum member are calculated to be 0.021 mm² and 0.342 mm², respectively. Thus, the ratio m in sectional areas is 0.06. The aluminum-stabilized superconducting wire 20 of the invention has an outside diameter of 1.5 mm, while the cross-sectional area of the copper member 6 is 0.527 mm². The diffusion heat treatment was conducted at 630° C. for 200 hours.

In order to confirm the effect of the invention, an experiment was conducted by using the aluminum-stabilized Nb3Sn fine multifilamentary superconducting wires of the invention and conventional Nb3Sn fine multifilamentary wires which are not stabilized by aluminum. More specifically, the conventional superconducting wire used in this experiment were prepared by substituting the Cu member 6 for the aluminum member 7 and the diffusion barrier layer 13 in the superconducting wires of the invention. Same sizes and conditions of diffusion heat treatment apply to both of the superconducting wires of the invention and the conventional superconducting wires. Thus, the cross-sectional area of copper member was 0.89 mm² in each of the conventional superconducting wires.

Figure 6:
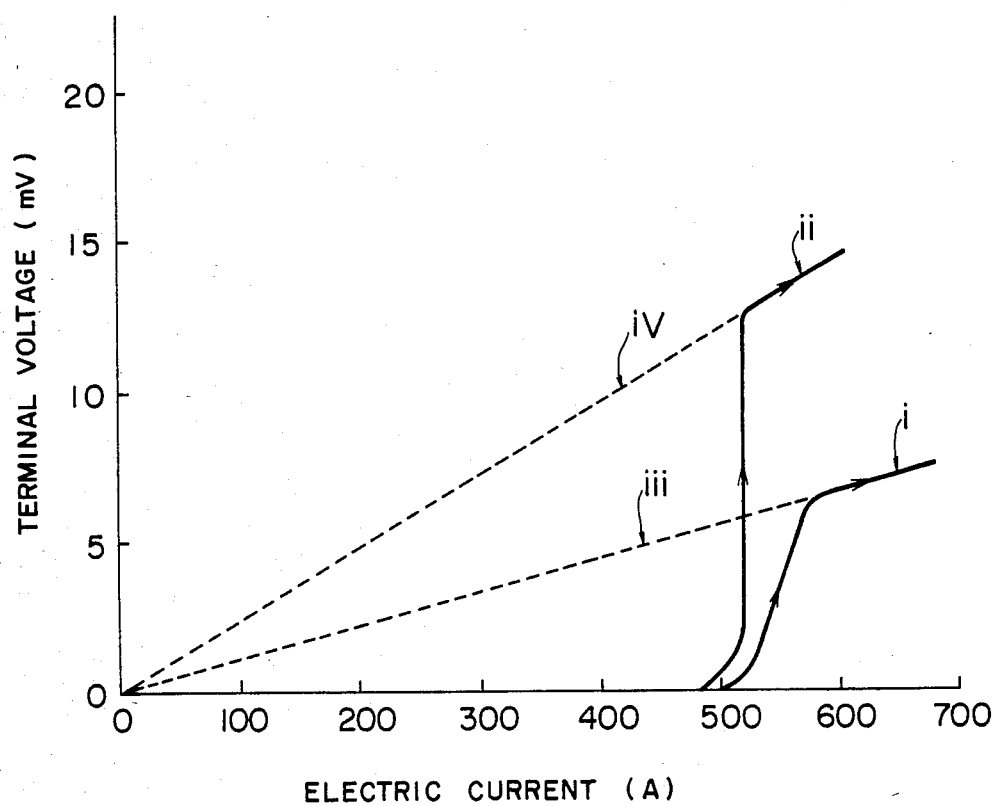
FIG. 6 is a diagram showing the effect brought about by the invention.

The experiment was conducted by placing a specimen of 15 cm long in the liquid helium of 4.2 K, applying a magnetic field of 10 tesla to the specimen perpendicularly to its lengthwise direction from the outside, and measuring the relationship between the electric current flowing in the specimen and the voltage occurring between the terminals, while increasing the level of the electric current. The distance between the terminals was selected to be 5 cm. The result of this experiment is shown in FIG. 6. In this Figure, solid-line curve (i) represents the properties of the superconducting wire of the invention, while the solid-line curve (ii) shows the properties of the conventional superconducting wire. The broken-line curves (iii) and (iv) show the resistance values of $2.2 \times 10^{-6}$ Ω/cm and $4.8 \times 10^{-6}$ Ω/cm, respectively, exhibited by the stabilizing material. Since the specimen is initially held in the superconducting state, the resistance is zero, i.e., no voltage occurs between the terminals, in the beginning period of increase in the electric current. However, as the electric current exceeds a predetermined threshold value, voltage becomes to occur between the terminals. This threshold value of electric current is generally referred to "critical current". A further increase in the electric current causes a shunting flow of electric current through the stabilizing material. Finally, the whole electric current flows through the stabilizing material.

From FIG. 6, it will be seen that the superconducting wire of the invention exhibits a critical current of about 500 A which is substantially equal to that (480 A) exhibited by the conventional superconducting wire. The resistance value of the stabilizing material was measured from the gradient of the voltage in relation to the electric current when the whole electric current flows through the stabilizing material. The measurement proved that, while the stabilizing material in the conventional superconducting wire exhibited a resistance value of $4.8 \times 10^{-6}$ $\Omega$/cm, that in the superconducting wire of the invention exhibited a resistance value of $2.2 \times 10^{-6}$ $\Omega$/cm which is less than a half of the former. From the result of this experiment, it is understood that the present invention provides an aluminum-stabilized $Nb_3Sn$ fine multifilamentary superconducting wire having an extremely high stability.

Next, a modified embodiment of the invention will be described hereinunder.

The current trend for new energy source has been directed also to the research and development for the realization of a nuclear fusion reactor. As is well known, the nuclear fusion reactor requires a plasma containment which in turn necessitates a superconducting magnet. The superconducting cable for the magnet is required to have a large electric current capacity of several tens of thousands amperes (A). In addition, from the viewpoint of safety, the superconducting cable has to be stabilized perfectly.

Figure 7:
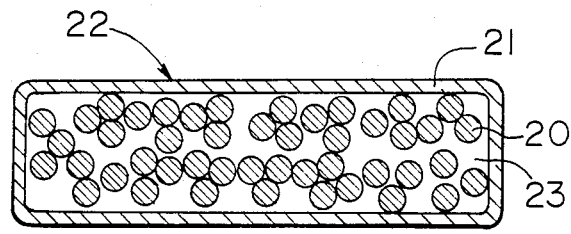
FIG. 7 is a sectional view of a modified embodiment of the aluminum-stabilized $Nb_3Sn$ fine multifilamentary superconducting wire in accordance with the invention.

Such a perfectly stabilized superconducting cable having a large electric current capacity can easily be produced by using the present invention. FIG. 7 shows the cross-section of an example of a superconducting cable 22 having a large electric current capacity, produced by applying the present invention. This cable 22 is constituted by 45 (fourty five) pieces of aluminum-stabilized $Nb_3Sn$ fine multifilamentary superconducting wires 20 in accordance with the invention stranded together and placed in a case 21 made of stainless steel in such a manner as to leave a vacant space 23 which constitutes the passage for liquid helium. The explanation about this modified embodiment intends to show the fact that when the aluminum-stabilized $Nb_3Sn$ fine multifilamentary superconducting wires of the invention are used it is made possible to easily increase the electric current capacity. For instance, when the aluminum-stabilized $Nb_3Sn$ fine multifilamentary superconducting wires of the aforesaid embodiment are used, a large capacity cable having a critical electric current of 22500 A under the influence of magnetic field of 10 tesla can be obtained.

As will be fully understood from the foregoing description including the embodiments, the present invention provides an aluminum-stabilized $Nb_3Sn$ fine multifilamentary superconducting wire which exhibits an extremely high stability and makes it possible to easily increase the electric current capacity.

What is claimed is:

1. An aluminum-stabilized superconducting wire comprising: an aluminum member disposed at the center portion of said wire; a copper member disposed at an outer portion of said wire; and a first diffusion barrier layer formed between said aluminum member and said copper member; said copper member containing a plurality of bundles each having a multiplicity of fine filaments of $Nb_3Sn$ embedded in a copper alloy and a second diffusion barrier layer surrounding said copper alloy.

2. An aluminum-stabilized superconducting wire according to claim 1, wherein the ratio m of the cross-sectional area of said first diffusion barrier layer to the cross-sectional area of said aluminum member is selected to meet the condition of $0.03 \leq m < 3$.

* * * * *